US 9,166,586 B2

(12) United States Patent
Carapelli et al.

(10) Patent No.: US 9,166,586 B2
(45) Date of Patent: Oct. 20, 2015

(54) FUEL DISPENSER INPUT DEVICE TAMPER DETECTION ARRANGEMENT

(75) Inventors: Giovanni Carapelli, Florence (IT); Philip A. Robertson, Wylie, TX (US); Alberto Tosi, Modena (IT)

(73) Assignees: Gilbarco Inc., Greensboro, NC (US); Gilbarco, S.r.l., Florence (IT)

( * ) Notice: Subject to any disclaimer, the term of this patent is extended or adjusted under 35 U.S.C. 154(b) by 773 days.

(21) Appl. No.: 13/467,592

(22) Filed: May 9, 2012

(65) Prior Publication Data
US 2013/0300453 A1    Nov. 14, 2013

(51) Int. Cl.
*H03K 19/003*    (2006.01)
*H05K 13/00*    (2006.01)

(52) U.S. Cl.
CPC .......... *H03K 19/003* (2013.01); *H05K 13/0023* (2013.01); *Y10T 29/49105* (2015.01)

(58) Field of Classification Search
USPC ....................................................... 324/711
See application file for complete search history.

(56) References Cited

U.S. PATENT DOCUMENTS

| | | | |
|---|---|---|---|
| 4,217,473 A | 8/1980 | Parkinson | |
| 4,218,600 A | 8/1980 | Kissner | |
| 4,811,288 A | 3/1989 | Kleijne et al. | |
| 4,977,528 A | 12/1990 | Norris | |
| 5,319,545 A | 6/1994 | McGarvey et al. | |
| 5,400,253 A | 3/1995 | O'Connor | |
| 5,423,457 A | 6/1995 | Nicholas et al. | |
| 5,448,638 A | 9/1995 | Johnson et al. | |
| 5,689,071 A | 11/1997 | Ruffner et al. | |
| 5,734,851 A | 3/1998 | Leatherman et al. | |
| 5,747,757 A | 5/1998 | Van Zeeland et al. | |
| 5,956,259 A | 9/1999 | Hartsell, Jr. et al. | |
| 6,052,629 A | 4/2000 | Leatherman et al. | |
| 6,435,204 B2 | 8/2002 | White et al. | |

(Continued)

FOREIGN PATENT DOCUMENTS

| | | |
|---|---|---|
| EP | 1408459 A1 | 4/2004 |
| WO | 2010111655 A1 | 9/2010 |

OTHER PUBLICATIONS

English Translation of First Office Action dated Feb. 5, 2015, issued by Chinese Patent Office for corresponding Chinese Patent Application No. 201280034593.2.

(Continued)

*Primary Examiner* — Thomas F Valone
(74) *Attorney, Agent, or Firm* — Nelson Mullins Riley & Scarborough, LLP

(57) ABSTRACT

A system for detecting unauthorized removal or tampering. The system comprises a printed circuit board having tamper-response electronics and a flexible circuit assembly defining a connector portion, a switch portion, and a cable extending between the connector portion and the switch portion. The flexible circuit assembly is coupled with the printed circuit board at the connector portion. The flexible circuit assembly comprises a plurality of layers each comprising a flexible dielectric substrate and a switch disposed in the switch portion. The switch is in electrical communication with the tamper-response electronics of the printed circuit board via a conductive path. The flexible circuit assembly also comprises a tamper-responsive conductor circuit enclosing the conductive path. The tamper-responsive conductor circuit is in electrical communication with the tamper-response electronics of the printed circuit board.

20 Claims, 11 Drawing Sheets

(56) References Cited

U.S. PATENT DOCUMENTS

| | | |
|---|---|---|
| 6,686,539 B2 | 2/2004 | Farquhar et al. |
| 6,853,093 B2 | 2/2005 | Cohen et al. |
| 6,935,191 B2 | 8/2005 | Olivier et al. |
| 7,151,461 B2 | 12/2006 | Wilson et al. |
| 7,214,874 B2 | 5/2007 | Dangler et al. |
| 7,289,877 B2 | 10/2007 | Wilson |
| 7,607,576 B2 | 10/2009 | Robertson et al. |
| 7,703,201 B2 | 4/2010 | Oggioni et al. |
| 7,710,286 B1 | 5/2010 | Thornley et al. |
| 7,832,628 B2 | 11/2010 | Mittler |
| 7,843,339 B2 | 11/2010 | Kirmayer |
| 7,898,413 B2 | 3/2011 | Hsu et al. |
| 7,902,993 B2 | 3/2011 | DeMarco |
| 2006/0102458 A1 | 5/2006 | Kim et al. |
| 2007/0271544 A1 | 11/2007 | Engstrom |
| 2008/0120191 A1 | 5/2008 | Long |
| 2008/0278353 A1 | 11/2008 | Smith et al. |
| 2009/0070583 A1 | 3/2009 | von Mueller et al. |
| 2009/0154696 A1 | 6/2009 | Robertson et al. |
| 2009/0222383 A1 | 9/2009 | Tato et al. |
| 2009/0265638 A1 | 10/2009 | Carapelli et al. |
| 2010/0268612 A1 | 10/2010 | Berrio et al. |
| 2011/0047081 A1 | 2/2011 | Kelly et al. |
| 2012/0286760 A1 | 11/2012 | Carapelli et al. |

OTHER PUBLICATIONS

International Search Report and Written Opinion of corresponding application No. PCT/US2012/037283, mailed Aug. 10, 2012.
Extended European Search Report issued on Oct. 30, 2014 in corresponding European patent application No. 12781772.4, all enclosed pages cited.

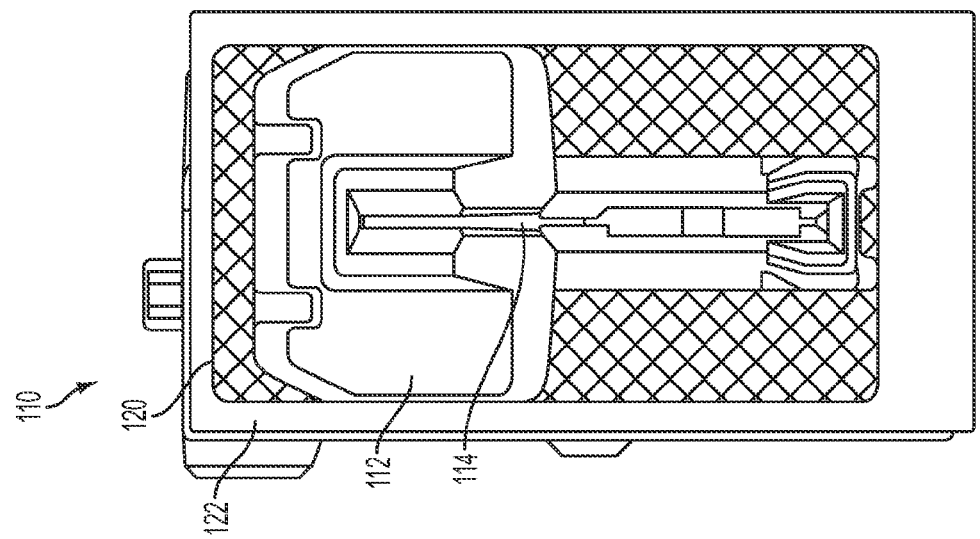
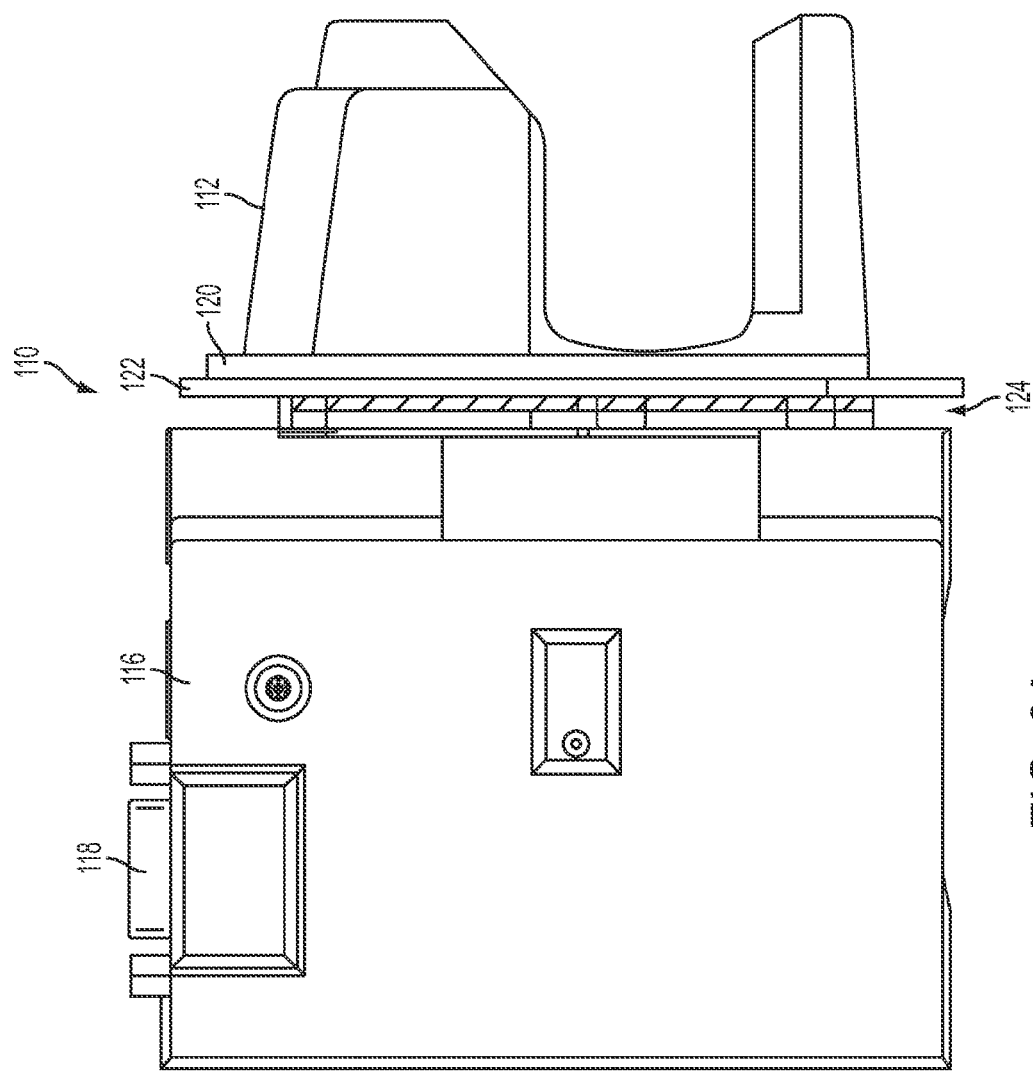

FUEL DISPENSER INPUT DEVICE TAMPER DETECTION ARRANGEMENT

FIELD OF THE INVENTION

The present invention relates generally to fuel dispenser and other retail payment systems. More particularly, the invention relates to sensors for detecting unauthorized removal of or tampering with a payment system user interface device.

BACKGROUND OF THE INVENTION

By way of background, payment systems have been incorporated into fueling sites in order to allow a customer to pay for fuel and other goods and services (such as a car wash, fast food, or convenience store products) using a credit or debit card. Such payment systems comprise various input devices, such as card readers and PIN pads, which are configured to accept data necessary to process the payment. The customer may provide certain payment data by presenting a payment card bearing a magnetic stripe or chip to a payment card reader. Data stored on the payment card may include one or more of the following: a Primary Account Number (PAN), the cardholder's name, a service code, and the card's expiration date. Also, if required to complete the transaction, the customer may enter account information such as a personal identification number (PIN) using a PIN entry device (e.g, PIN pad). The system communicates the data to a remote host system responsible for the customer's account for verification.

Because of the continuing challenges fraud poses to customers, merchants, and banks, among others, payment card companies are requiring more and more security during payment card transactions. Thus, organizations that process, store, or transmit payment data must comply with certain industry standards. These industry standards typically require that input devices (e.g., card readers and PIN entry devices) meet certain physical security requirements, including containing an anti-removal mechanism, also known as a dismount sensor. In the past, these anti-removal mechanisms included cable-based switches positioned in hard to access locations which provided some degree of protection for both the cable and switch. Other anti-removal mechanisms included microswitches on the input device that closed when the input device was mounted to a structure. In both cases, the input devices did not include security around the interface between the switch and the structure and did not provide enough inherent security to meet new, more demanding payment card company mandates.

SUMMARY

The present invention recognizes and addresses disadvantages of prior art constructions and methods. According to one embodiment, the present invention provides a system for detecting unauthorized removal or tampering. The system comprises a printed circuit board having tamper-response electronics and a flexible circuit assembly defining a connector portion, a switch portion, and a cable extending between the connector portion and the switch portion. The flexible circuit assembly is coupled with the printed circuit board at the connector portion. The flexible circuit assembly comprises a plurality of layers each comprising a flexible dielectric substrate and a switch disposed in the switch portion. The switch is in electrical communication with the tamper-response electronics of the printed circuit board via a conductive path. The flexible circuit assembly also comprises a tamper-responsive conductor circuit enclosing the conductive path. The tamper-responsive conductor circuit is in electrical communication with the tamper-response electronics of the printed circuit board.

According to a further embodiment, the present invention comprises a method of detecting unauthorized removal or tampering. The method comprises the steps of providing a printed circuit board having tamper-response electronics and providing a flexible circuit assembly comprising a switch portion comprising a connector portion, a switch portion, and a cable extending between the connector portion and the switch portion. The switch portion comprises a first half and a second half connected by a hinge portion. The flexible circuit assembly further comprises a plurality of layers each comprising a flexible dielectric substrate and a switch disposed in the switch portion. The switch is in electrical communication with the tamper-response electronics of the printed circuit board via a conductive path. Further, the flexible circuit assembly comprises a first tamper-responsive conductor circuit enclosing the conductive path. The first tamper-responsive conductor circuit is in electrical communication with the tamper-response electronics of the printed circuit board. The method further comprises mounting the flexible circuit assembly to the printed circuit board at the connector portion and folding the switch portion at the hinge portion and securing the first half over the second half to embed the switch between the first and second halves.

Those skilled in the art will appreciate the scope of the present invention and realize additional aspects thereof after reading the following detailed description of preferred embodiments in association with the accompanying drawing figures.

BRIEF DESCRIPTION OF THE DRAWINGS

A full and enabling disclosure of the present invention, including the best mode thereof directed to one of ordinary skill in the art, is set forth in the specification, which makes reference to the appended drawings, in which:

FIG. 3A is a side view of a secure card reader input device according to an embodiment of the present invention.

FIG. 3B is a front view of the input device of FIG. 3A.

Figure 1:
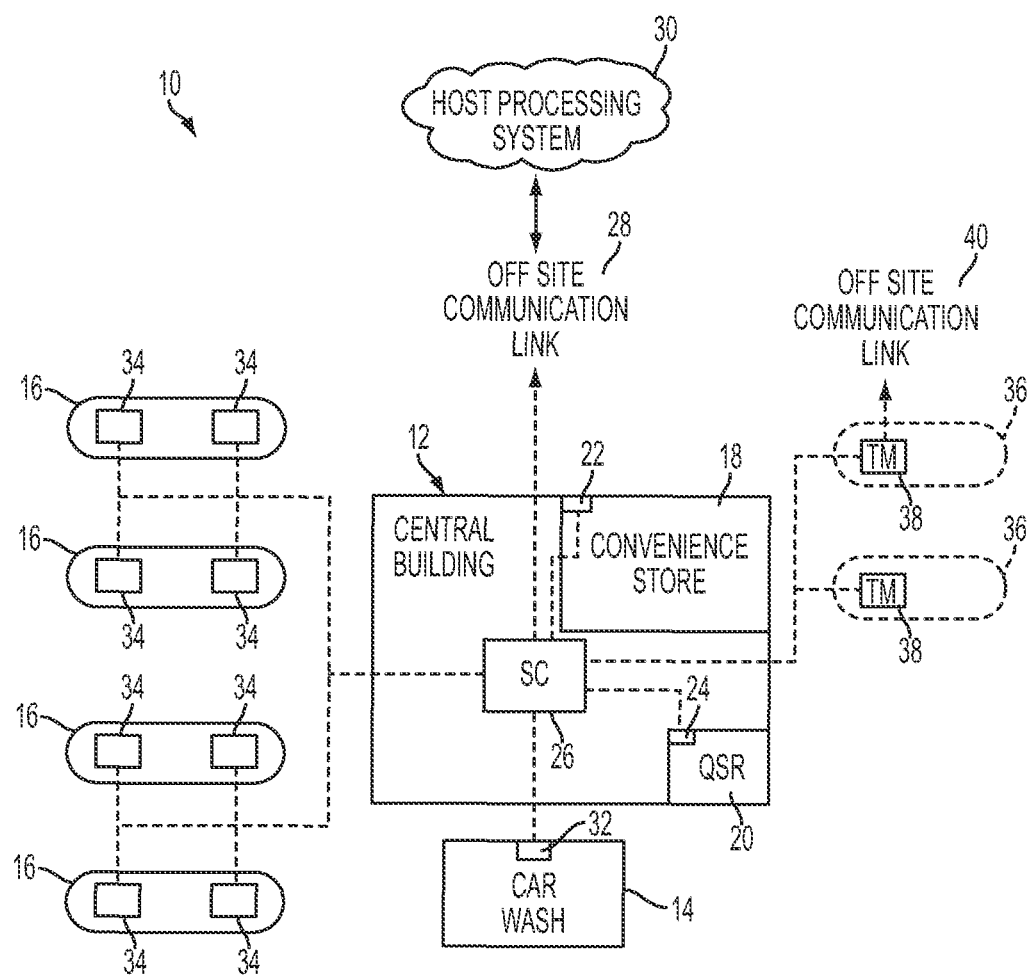
FIG. 1 is a diagrammatic representation of a retail fuel dispensing environment in which an embodiment of the present invention may be utilized.

Repeat use of reference characters in the present specification and drawings is intended to represent same or analogous features or elements of the invention.

DETAILED DESCRIPTION OF PREFERRED EMBODIMENTS

Reference will now be made in detail to presently preferred embodiments of the invention, one or more examples of which are illustrated in the accompanying drawings. Each example is provided by way of explanation of the invention, not limitation of the invention. In fact, it will be apparent to those skilled in the art that modifications and variations can be made in the present invention without departing from the scope or spirit thereof. For instance, features illustrated or described as part of one embodiment may be used on another embodiment to yield a still further embodiment. Thus, it is intended that the present invention covers such modifications and variations as come within the scope of the appended claims and their equivalents.

Embodiments of the present invention provide a multiple layer flexible circuit assembly which may be used to provide tamper-response security for one or more input devices. As used herein, the term "input device" broadly refers to secure devices, including but not limited to encrypting PIN pads, keypads, touchscreens, secure card readers, and smartcard readers, which are capable of receiving information associated with a user of the input device. Such information may include information associated with a payment card, such as a PAN or other account number, the user's name, a service code, and the card's expiration date. Further, such information can include data associated with payment devices processed on-site or in a private retailer's network, such as data from loyalty or program-specific cards.

Desirably, many input devices which may be used with the present invention include a secure area comprising a processor, a memory or storage unit, and tamper-response electronics. The memory of the input devices may store one or more encryption algorithms, keys, and/or ciphers used to immediately encrypt input information upon receipt. In a preferred embodiment, the input devices may allow triple-DES derived unique key per transaction (DUKPT) encryption of input information. As described below, in the case of unauthorized access or tampering detected at the tamper-response electronics, the input device's contents, including data contained in or handled by the input device's processor and/or memory, are preferably erased, deleted, or destroyed. Alternatively, any portion of the contents of the input device sufficient to identify input information or encryption algorithms, keys, and/or ciphers is erased should tampering occur.

The term "layer" as used herein refers generally to one or more sheets, films, substrates, or the like, which serve a particular function (e.g., switching, security mesh, ground plane) in a flexible circuit assembly. Thus, in some embodiments, a layer may comprise printed circuits, switches, or other electronic components, adhesives, insulating materials, shields, and/or sealants.

Some embodiments of the present invention are particularly suitable for use with input devices in a retail service station environment, and the below discussion will describe preferred embodiments in that context. However, those of skill in the art will understand that the present invention is not so limited. In fact, it is contemplated that the present invention be used with any appropriate retail environment. Additionally, it is contemplated that the present invention be used with any suitable input device carrying information that requires protection from tampering.

Referring now to FIG. 1, an exemplary fueling environment 10 may comprise a central building 12, a car wash 14, and a plurality of fueling islands 16. The central building 12 need not be centrally located within the fueling environment 10, but rather is the focus of the fueling environment 10, and may house a convenience store 18 and/or a quick serve restaurant 20 therein. Both the convenience store 18 and the quick serve restaurant 20 may include a point of sale (POS) 22, 24, respectively. POS 22, 24 may comprise a single computer or server operatively connected to an associated card reader and payment terminal. Additionally, POS 22, 24 may include a display, a touch screen, and/or other input devices.

The central building 12 may further house a site controller (SC) 26, which in an exemplary embodiment may be the PASSPORT® POS system, sold by Gilbarco Inc. of Greensboro, N.C., although third party site controllers may be used. Site controller 26 may control the authorization of fueling transactions and other conventional activities as is well understood, and site controller 26 may preferably be in operative communication with each POS. Alternatively, site controller 26 may be incorporated into a POS, such as point of sale 22 if needed or desired.

Further, site controller 26 may have an off-site communication link 28 allowing communication with a remote host processing system 30 for credit/debit card authorization, content provision, reporting purposes or the like, as needed or desired. In one embodiment, communication link 28 may be a stand alone router, switch, or gateway, although it should be appreciated that site controller 26 may additionally perform the functions of, and therefore replace, such a device. The off-site communication link 28 may be routed through the Public Switched Telephone Network (PSTN), the Internet, both, or the like, as needed or desired. Remote host processing system 30 may comprise at least one server maintained by a third party, such as a financial institution. Although only one remote host processing system 30 is illustrated, those of skill in the art will appreciate that in a retail payment system allowing payment via payment devices issued by multiple payment card companies or financial institutions, site controller 26 may be in communication with a plurality of remote host processing systems 30.

Car wash 14 may have a POS 32 associated therewith that communicates with site controller 26 for inventory and/or sales purposes. Car wash 14 alternatively may be a stand alone unit. Note that car wash 14, convenience store 18, and quick serve restaurant 20 are all optional and need not be present in a given fueling environment.

Fueling islands 16 may have one or more fuel dispensers 34 positioned thereon. Fuel dispensers 34 may be, for example, the ENCORE® fuel dispenser sold by Gilbarco Inc. of Greensboro, N.C. Fuel dispensers 34 are in electronic communication with site controller 26 through any suitable link, such as two wire, RS 422, Ethernet, wireless, etc. if needed or desired.

Fueling environment 10 also has one or more underground storage tanks (USTs) 36 adapted to hold fuel therein. As such, USTs 36 may each be a double walled tank. Further, each LIST 36 may include a tank monitor (TM) 38 associated therewith. Tank monitors 38 may communicate with fuel dispensers 34 (either through site controller 26 or directly, as needed or desired) to determine amounts of fuel dispensed and compare fuel dispensed to current levels of fuel within USTs 36 to determine if USTs 36 are leaking.

Tank monitor 38 may communicate with site controller 26 and further may have an off-site communication link 40 for leak detection reporting, inventory reporting, or the like. Much like off-site communication link 28, off-site communication link 40 may be through the PSTN, the Internet, both, or the like. If off-site communication link 28 is present, off-site communication link 40 need not be present and vice versa, although both links may be present if needed or desired.

Further information on and examples of fuel dispensers and retail fueling environments are provided in U.S. Pat. Nos. 6,435,204 (entitled "Fuel Dispensing System"); 5,956,259 (entitled "Intelligent Fueling"); 5,734,851 (entitled "Multimedia Video/Graphics in Fuel Dispensers"); 6,052,629 (entitled "Internet Capable Browser Dispenser Architecture"); 5,689,071 (entitled "Wide Range, High Accuracy Flow Meter"); 6,935,191 (entitled "Fuel Dispenser Fuel Flow Meter Device, System and Method"); and 7,289,877 (entitled "Fuel Dispensing System for Cash Customers"), all of which are incorporated herein by reference in their entireties for all purposes. An exemplary tank monitor 38 may be the TLS-450 manufactured and sold by the Veeder-Root Company of Simsbury, Conn. For more information about tank monitors and their operation, reference is made to U.S. Pat. Nos. 5,423,457 (entitled "Real time tank product loss detection system"); 5,400,253 (entitled "Automated Statistical Inventory Reconciliation System for Convenience Stores and Auto/truck Service Stations"); 5,319,545 (entitled "System to Monitor Multiple Fuel Dispensers and Fuel Supply Tank"); and 4,977,528 (entitled "Apparatus and Method for Determining the Amount of Material in A Tank"), all of which are incorporated by reference herein in their entireties for all purposes.

Figure 2:
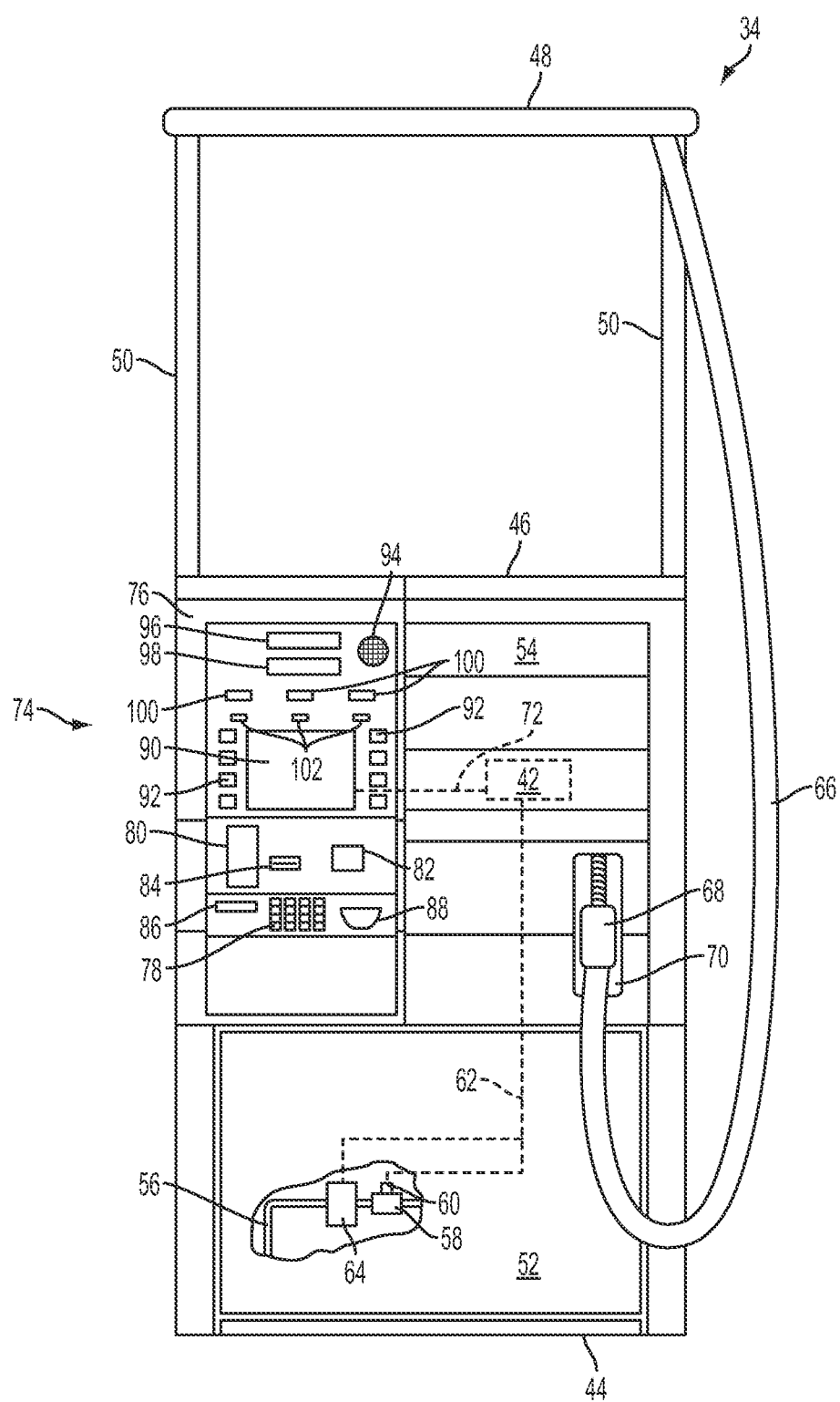
FIG. 2 is a front elevational view of an exemplary fuel dispenser that may operate with a POS device and/or a site controller within the retail fueling environment of FIG. 1.

FIG. 2 illustrates a fuel dispenser 34 that may operate in association with site controller 26 according to an embodiment of the present invention. Dispenser 34 includes a control system 42, which may be a processor, microprocessor, controller, microcontroller, or other suitable electronics with associated memory and software programs running thereon. In a preferred embodiment, control system 42 is comparable to the microprocessor-based control systems used in CRIND and TRIND type units sold by Gilbarco Inc. Control system 42 is in operative communication with site controller 26. Control system 42 further controls various aspects of the fuel dispenser 34 as described in more detail below.

The memory of control system 42 may be any suitable memory or computer-readable medium as long as it is capable of being accessed by the control system, including random access memory (RAM), read-only memory (ROM), erasable programmable ROM (EPROM), or electrically EPROM (EEPROM), CD-ROM, DVD, or other optical disk storage, solid-state drive (SSD), magnetic disc storage, including floppy or hard drives, any type of suitable non-volatile memories, such as secure digital (SD), flash memory, memory stick, or any other medium that may be used to carry or store computer program code in the form of computer-executable programs, instructions, or data. Control system 42 may also include a portion of memory accessible only to control system 42.

In the illustrated embodiment, dispenser 34 has a base 44 and a top 46, with a canopy 48 supported by two side panels 50. Fuel dispenser 34 is subdivided into multiple compartments. In this regard, a hydraulic area 52 encloses hydraulic components and an electronic area 54 encloses electronic components. A vapor barrier may be used to separate the hydraulic area 52 from the electronic area 54.

Several components used to control fuel flow may be housed within the hydraulic area 52. Fuel from USTs 36 is pumped through a piping network into inlet pipe 56. Fuel being dispensed passes though a meter 58, which is responsive to flow rate or volume. A displacement sensor 60 (e.g., pulser) is employed to generate a signal in response to fuel flow though the meter 58. Signals indicative of the flow of fuel being dispensed are provided to control system 42 via control lines 62. Control/data lines 62 may provide control signaling to a valve 64 that may be opened and closed to permit or not permit dispensing of fuel.

Meter flow measurements from sensor 60 are collected by control system 42. Control system 42 also typically performs calculations such as cost associated with a fuel dispensing transaction. Additionally, control system 42 controls transactional processing at fuel dispenser 34 as will be described in more detail below.

As a dispensing transaction progresses, fuel is then delivered to a hose 66 and through a nozzle 68 into the customer's vehicle. Dispenser 34 includes a nozzle boot 70, which may be used to hold and retain nozzle 68 when not in use. Nozzle boot 70 may include a mechanical or electronic switch to indicate when nozzle 68 has been removed for a fuel dispensing request and when nozzle 68 has been replaced, signifying the end of a fueling transaction. A control line provides a signaling path from the electronic switch to control system 42. Control system 42 may use signaling received via the control line in order to make a determination as to when a transaction has been initiated or completed.

Control/data lines 72 provide electronic communication between control system 42 and a user interface 74. User interface 74 includes various combinations of subsystems to facilitate customer interaction with dispenser 34 and acceptance of payment for dispensed fuel. A bezel 76 acts as a lip around the various subsystems of interface 74. In most cases, bezel 76 is flush with the face of the fuel dispenser; however, in some embodiments it may extend outwardly from the face, in effect forming a raised lip. Bezel 76 may also comprise a plurality of sections that frame or house various subsystems or components.

As shown, user interface 74 includes several input devices. For example, user interface 74 may include a keypad 78. Keypad 78 is typically used for entry of a PIN if the customer is using a debit card for payment of fuel or other goods or services. In a preferred embodiment, keypad 78 may be the FlexPay™ encrypting PIN pad offered by Gilbarco Inc. User interface 74 may also include a secure card reader 80 for accepting credit, debit, or other chip or magnetic stripe cards for payment. Additionally, secure card reader 80 may accept loyalty or program-specific cards.

User interface 74 may also include other input devices such as a contactless card reader 82 (e.g., for integrated circuit or "smart" cards). Further, user interface 74 may include other payment or transactional devices such as a bill acceptor 84, a receipt printer 86, and a change delivery device 88. Receipt printer 86 may provide a customer with a receipt of the transaction carried out at fuel dispenser 34. Change delivery device 88 may deliver change to a customer for overpayment. Other transactional devices, such as an optical reader and a biometric reader, are also contemplated.

A display 90 may be used to display information, such as transaction-related prompts and advertising, to the customer. In some embodiments, a touch screen may be used for display 90. In this case, display 90 may be configured to display a virtual keypad for receiving payment data such as a PIN of a debit card or the billing zip code of a credit card, for instance. Display 90 may also be used to receive a selection from the customer regarding the displayed information.

The customer may use soft keys 92 to respond to information requests presented to the user via the display 90. An intercom 94 may be provided to generate audible cues for the customer and to allow the customer to interact with an attendant. In addition, dispenser 34 may include a transaction price total display 96 that presents the customer with the price for fuel that is dispensed. A transaction gallon total display 98 may be used to present the customer with the measurement of fuel dispensed in units of gallons or liters. Octane selection buttons 100 may be provided for the customer to select which grade of fuel is to be dispensed before dispensing is initiated. Finally, price per unit (PPU) displays 102 may be provided to show the price per unit of fuel dispensed in either gallons or liters, depending on the programming of dispenser 34.

As noted above, embodiments of the invention relate to sensors for detecting unauthorized removal of or tampering with one or more input devices. For example, some embodiments provide a flexible circuit assembly which may be used for detecting tampering at a card reader. In this regard, FIG. 3A is a side view of a secure card reader input device 110, and FIG. 3B is a front view of secure card reader 110. Although some embodiments of the present invention are described below with reference to card reader 110, those of skill in the art will appreciate that the present invention may be used with any suitable input device.

Card reader 110 may comprise a dual-sided read head 112 for receiving information from a payment card, such as a magnetic stripe or EMV card, which may be inserted into a read slot 114. Card reader 110 may further comprise a housing 116 containing card reader electronics (described in more detail below) and at least one input-output ("I/O") port 118 for receiving and loading encryption keys. In presently preferred embodiments, secure card reader 110 may be similar to the MagTek® PermaSeal secure card reader or the FlexPay™ secure card reader offered by Gilbarco Inc.

As will be appreciated, card reader 110 may be configured for mounting with a bezel of a fuel dispenser, such as bezel 76 described above. Thus, card reader 110 may define a front face 120 and a flange 122 disposed behind front face 120. After mounting, front face 120 is flush with a front surface of the bezel and flange 122 adjoins a rear surface of the bezel. Because flange 122 defines a larger area than front face 120, flange 122 prevents removal of card reader 110 from the front of the bezel and offers a measure of weather protection for the electronics in housing 116.

A bracket may preferably be used to secure card reader 110 to the bezel, although other mounting methods are contemplated. As shown in FIG. 3A, card reader 110 may preferably define a gap 124 about its periphery between housing 116 and flange 122. Gap 124 is sized to receive a thin, u-shaped bracket which may be removably attached to card reader 110 by friction-fit. The bracket may preferably have an area larger than that of flange 122 and define a plurality of apertures. The apertures may be sized to receive mounting screws or other fasteners. As the bracket is coupled to the bezel, flange 122 is forced toward the rear surface of the bezel to secure card reader 110 in place.

Generally, according to embodiments of the present invention, a flexible circuit assembly may be coupled between an input device and a structure to which the input device is mounted. Preferably, pressure applied to the flexible circuit assembly during mounting actuates at least one switch in a layer of the flexible circuit assembly to complete a removal detection circuit. Thus, when the device is removed during an attempt to compromise the device, the removal detection circuit will be opened. The input device (or another associated device mounted in the structure) is preferably provided with tamper-response electronics in electronic communication with the flexible circuit assembly to detect the removal attempt and take appropriate action to prevent fraud.

Figure 4:
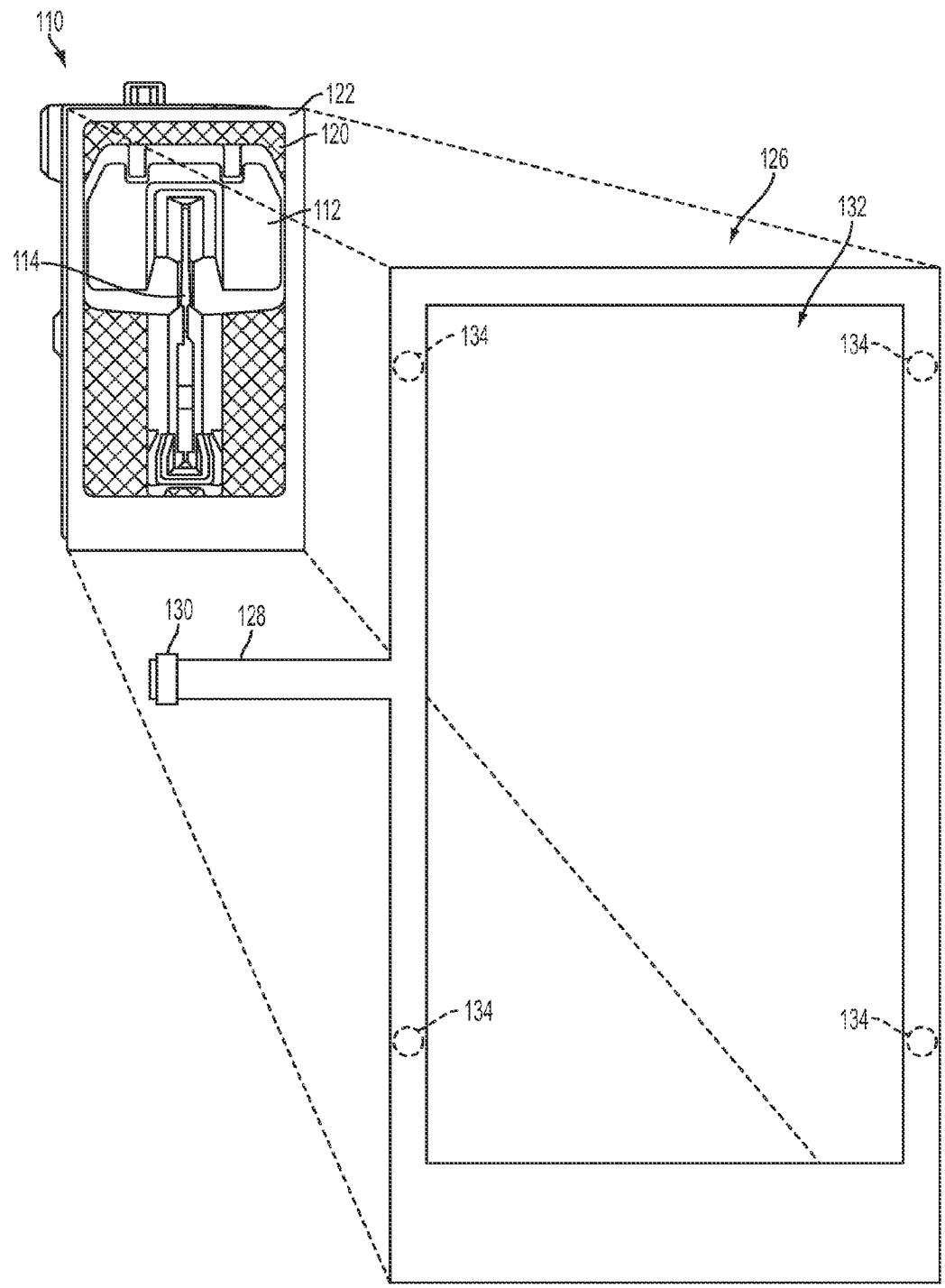
FIG. 4 is a front view of a flexible circuit assembly constructed in accordance with an embodiment of the present invention and configured to detect tampering with the input device of FIGS. 3A and 3B.

A flexible circuit assembly of the present invention may be coupled with an input device in many different locations depending on the input device in question and the method by which it is mounted to a structure. By way of example, however, FIG. 4 is a front view of a flexible circuit assembly 126 configured for use with secure card reader 110. As described below, flexible circuit assembly 126 may comprise two or more layers and be in electrical communication with a secure area in card reader 110 via a cable 128 and a connector 130. In the illustrated embodiment, flexible circuit assembly 126 defines an aperture 132 sized to be received over front surface 120 of card reader 110. Thus, flexible circuit assembly 126 may be affixed to flange 122, for example during manufacturing, with suitable adhesive.

When card reader 110 is secured to a fuel dispenser bezel, flexible circuit assembly 126 may be compressed between flange 122 and the rear surface of the bezel. As described below, this pressure on flexible circuit assembly 126 preferably closes one or more swatches disposed in a layer of flexible circuit assembly 126. Here, four such switches 134 are shown schematically.

Figure 5:
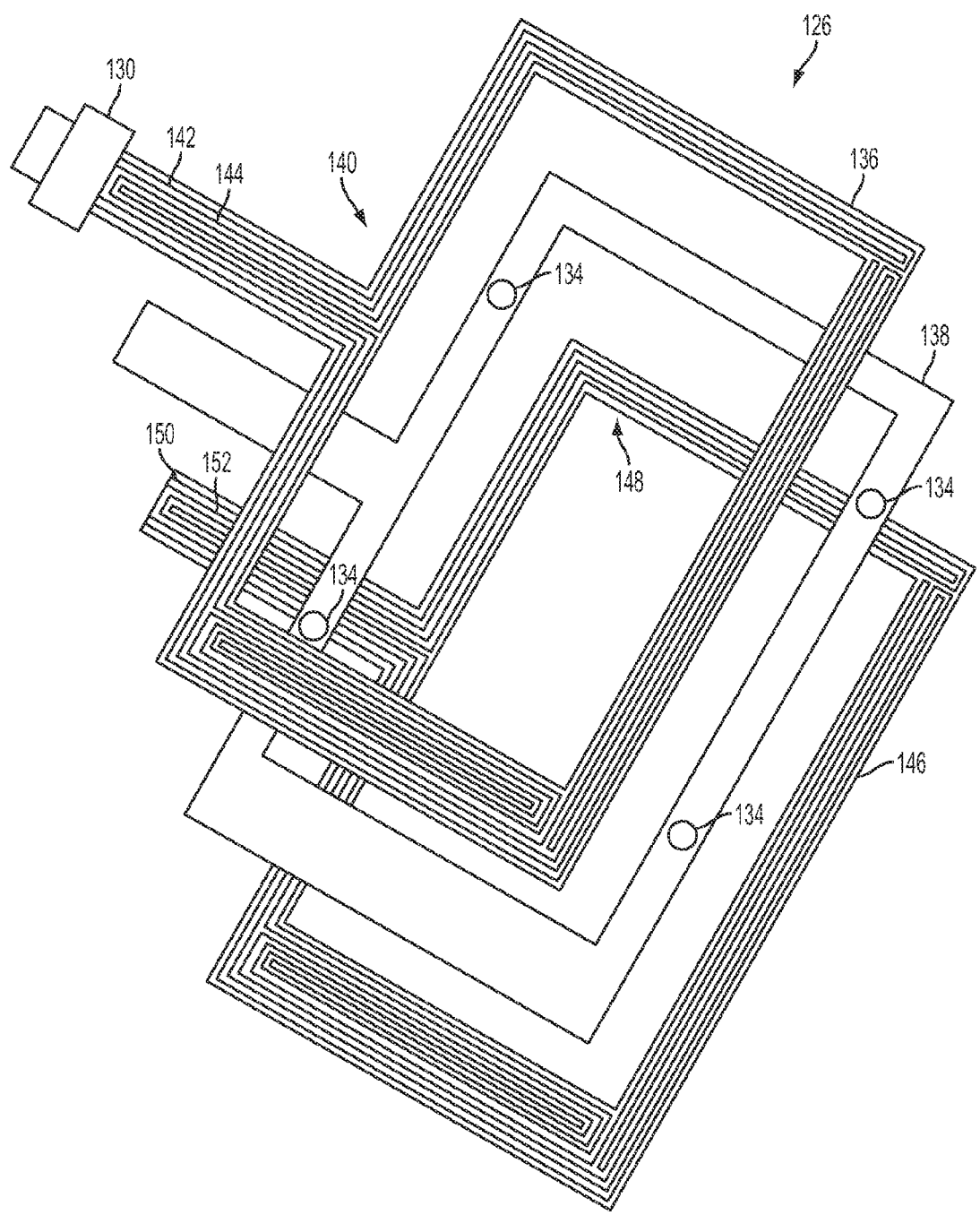
FIG. 5 is an exploded perspective view illustrating layers of the flexible circuit assembly of FIG. 4 according to an embodiment of the present invention.

FIG. 5 is an exploded perspective view illustrating layers of flexible circuit assembly 126 according to an embodiment of the present invention. In particular, flexible circuit assembly 126 preferably comprises an outer layer 136 and a first inner layer 138. Additionally, as shown, one or more of the layers of flexible circuit assembly 126 may have portions that define cable 128. However, cable 128 may also be separately provided. First inner layer 138 may be disposed between the input device and outer layer 136. Layers 136, 138 preferably comprise a suitable thin, flexible dielectric substrate, such as polyethylene terephthalate (PET) or polyimide. In one embodiment, the flexible dielectric substrate may comprise Kapton® polyimide film offered by DuPont. A suitable adhesive, such as a pressure-sensitive adhesive, or another adhesive layer is used to connect layers 136, 138.

Outer layer 136 preferably comprises a first tamper-responsive conductor circuit 140. Those of skill in the art are familiar with tamper-responsive conductor circuits (sometimes referred to as tamper-responsive "mesh"). For example, tamper-responsive conductor circuit 140 may be formed of a pair of closely-spaced conductive patterns 142, 144 screen printed onto the flexible substrate of outer layer 136. (It will be appreciated that other deposition techniques may be used to form patterns 142, 144 on the flexible substrate.) Conductive patterns 142, 144 may be formed of any suitable conductive material, such as silver or copper, and follow a serpentine path along the flexible substrate. Additionally, although not shown in FIG. 5 for clarity, outer layer 136 may comprise an opaque coating or insulating layer formed over tamper-responsive conductor circuit 140. The use of an opaque coating can further improve security, making it more difficult to determine how to compromise the tamper-responsive security features.

Patterns 142, 144, which preferably substantially cover outer layer 136, begin and terminate at connector 130. Thus, tamper-responsive conductor circuit 140 may preferably be adapted for electrical communication with tamper-response electronics in a secure area of an input device. Further, the tamper-responsive conductor circuit extends over the portion of outer layer 136 defining part of cable 128, and thus the connection between the tamper-response electronics and flexible circuit assembly 126 is also protected against tampering. Those of skill in the art will appreciate that, in use, tamper-response electronics continuously monitor one or more electrical characteristics (such as resistance or voltage) of conductive patterns 142, 144. Patterns 142, 144 are preferably positioned such that tampering will cause either or both of patterns 142, 144 to break or a short to occur. The tamper-response electronics will then detect a change in one or more electrical characteristics and take appropriate action to prevent fraud, such as setting an alarm and disabling the input device or erasing or overwriting a memory of the input device.

As explained above, flexible circuit assembly 126 preferably comprises one or more switches configured to close when flexible circuit assembly 126 is mounted. Preferably, these switches are disposed in first inner layer 138 and function to selectively complete a removal detection circuit as described below. Although any suitable switch can be used, the switches may preferably be momentary contact, push button type devices typically found in membrane switches. As shown, switches 134 may preferably be similar to the membrane switches offered by Xymox Technologies, Inc. of Milwaukee, Wis. Alternatively, the switches may be disposed in another layer, such as outer layer 136, in some embodiments.

Thus, for example, the flexible substrate of first inner layer 138 may comprise printed conductors forming a circuit having open contacts at the locations of switches 134. First inner layer 138 may also comprise a spacer layer to space a second flexible substrate containing conductive pads or the like from the substrate on which the circuit is printed. Although the spacer layer normally holds the conductive pads out of contact with the open contacts, pressure applied to the area of switches 134 causes the conductive pads to complete the circuit. In some embodiments, switches 134 may be tactile and comprise a metal (e.g., stainless steel) or polyester dome. Additional background information regarding the construction of suitable membrane switches is provided in U.S. Pat. Nos. 4,217,473 to Parkinson and 4,218,600 to Kissner, each of which is incorporated herein by reference in its entirety for all purposes.

Although some embodiments of flexible circuit assembly 126 may comprise only outer layer 136 and first inner layer 138, additional tamper-response security may obtain by providing a second inner layer 146 (preferably made of a material similar to that of layers 136 and 138). Second inner layer 146 may be disposed between first inner layer 138 and the input device to which flexible circuit assembly 126 is affixed. Also, second inner layer 146 preferably comprises a second tamper-responsive conductor circuit 148 formed of printed conductors 150, 152. Second inner layer 146 and tamper-responsive conductor circuit 148 are preferably analogous to first inner layer 136 and tamper-responsive conductor circuit 140, respectively. Additionally, in some embodiments tamper-responsive conductor circuits 140, 148 may be combined to form a single tamper-responsive conductor circuit spanning multiple layers.

As noted above, in many embodiments, flexible circuit assembly 126 is preferably in electrical communication with a secure area of an input device. Generally, the secure area may be a tamper-protected physical enclosure for components of an input device which carry sensitive information, such as encryption keys or customer account numbers. Thus, the secure area may be protected by one or more tamper-responsive conductor circuits and/or encased in epoxy or the like. Background information regarding secure areas for electronic components of an input device is found in U.S. Pat. No. 6,853,093 to Cohen et al., the entire disclosure of which is incorporated herein by reference for all purposes.

Figure 6:
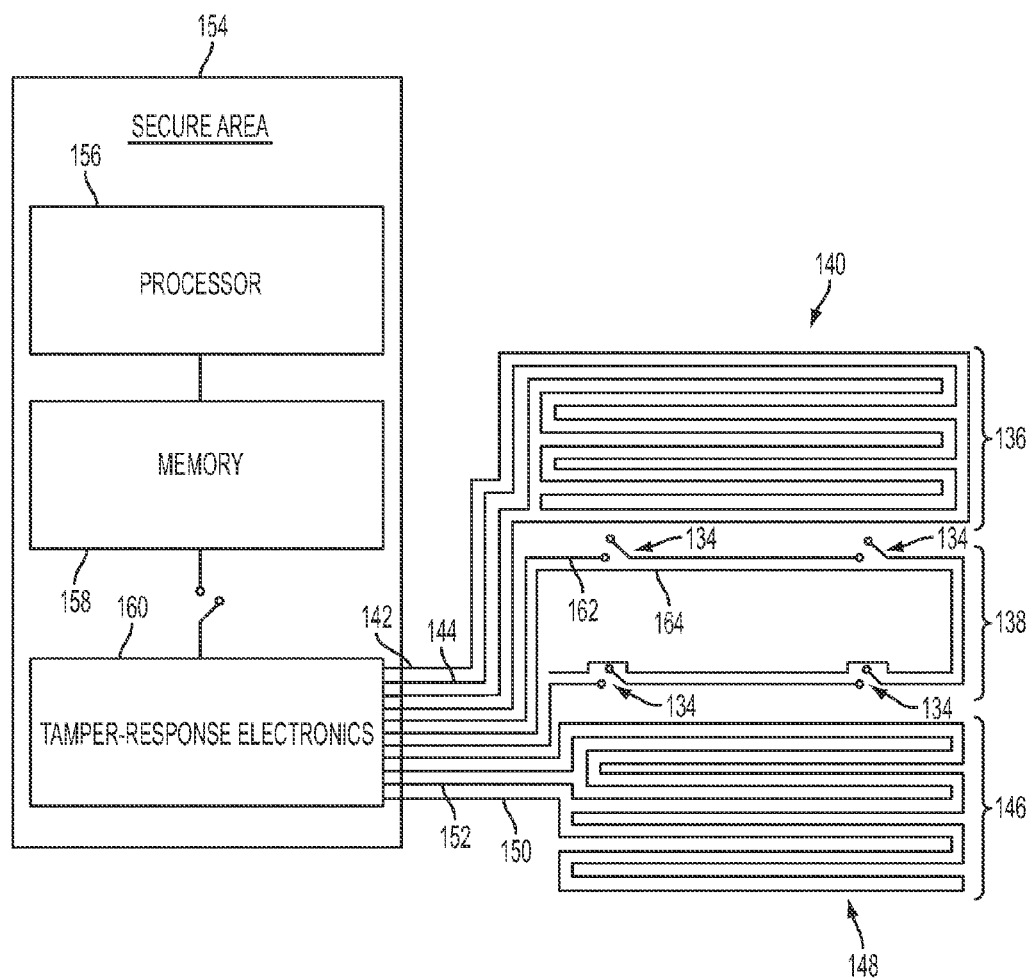
FIG. 6 is a diagrammatic representation of an exemplary secure area of the input device of FIGS. 3A and 3B in electrical communication with the tamper-responsive conductor circuits, removal detection circuit, and foreign conductor detection circuit of the flexible circuit assembly of FIGS. 4 and 5 according to an embodiment of the present invention.

More particularly, FIG. 6 is a diagrammatic representation of an exemplary secure area 154 of card reader 110 coupled with the circuits in flexible circuit assembly 126. Cable 128, explained above, preferably connects the circuits and electronic components in flexible circuit assembly 126 to secure area 154. Secure area 154 may house, among other components, a processor 156 in electronic communication with at least one memory 158 and tamper-response electronics 160. As is well known, processor 156 may carry out encryption, functional, and control processing for card reader 110. Memory 158 may store one or more types of sensitive information, including encryption keys or customer account information.

The circuits in flexible circuit assembly 126 may be in electrical communication with tamper-responsive electronics 160. Tamper-responsive conductor circuits 140, 148 were described above with reference to FIG. 5. As shown in FIG. 6, switches 134 of inner layer 138 are preferably configured to selectively complete a removal detection circuit 162. In particular, when card reader 110 is mounted against a bezel, pressure on flexible circuit assembly 126 causes switches 134 to close. Then, if unauthorized removal of card reader 110 is attempted, one or more of switches 134 may open, breaking removal detection circuit 162 and causing a tamper response. Switches 134 are illustrated connected in series in removal detection circuit 162 only to facilitate illustration, and those of skill in the art will appreciate that switches 134 may be connected in parallel.

FIG. 6 also illustrates a second layer of security in inner layer 138 to defend against attacks by injected foreign conductors. Specifically, a foreign conductor detection circuit 164, which is normally open, is disposed in inner layer 138 adjacent removal detection circuit 162. When trying to compromise an input device, a tamperer may attempt to inject a foreign conductor (such as a conductive liquid) into inner layer 138 to short removal detection circuit 162. In this case, however, circuit 164 is preferably positioned with respect to removal detection circuit 162 such that, if the tamperer attempts to create a short around switches 134, the foreign conductor will also contact circuit 164. Such contact will complete circuit 164 and cause a tamper-response.

Tamper-response electronics 160 preferably monitor the electrical characteristics of the circuits in flexible circuit assembly 126 and provide outputs to processor 156. Processor 156 may determine whether a change in a measured parameter indicates tampering, such as where the parameter exceeds a predetermined threshold. If tampering is indicated, processor 156 may instruct tamper-response electronics 160 to erase and/or overwrite the data stored in memory 158. Alternatively, processor 156 may set a tamper flag and disable card reader 110 until card reader 110 is "rearmed" by authorized service personnel.

Those of skill in the art will appreciate that processor 156, memory 158, and tamper-response electronics 160 are shown as discrete elements only to facilitate description of preferred embodiments. In other embodiments, any or all of these elements may be arranged differently and/or combined, such as into one or more integrated circuits.

Figure 7:
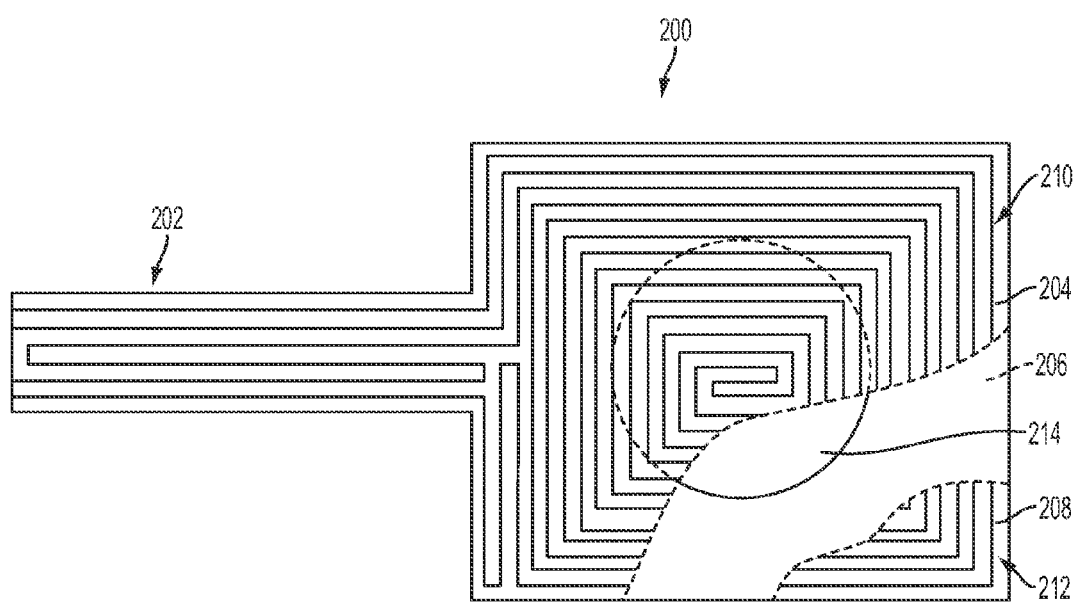
FIG. 7 is a plan view of a flexible circuit assembly according to a further embodiment of the present invention shown with an outer layer partially broken away for purposes of illustration.

FIG. 7 is a plan view of a flexible circuit assembly 200 shown in partial section according to a further embodiment of the present invention. Flexible circuit assembly 200 is in many respects similar to flexible circuit assembly 126 and comprises a cable 202 for connection to a secure area of an input device, outer layer 204, first inner layer 206, and second inner layer 208. Outer layer 204 and second inner layer 208 respectively include tamper-responsive conductor circuits 210, 212. However in this embodiment, flexible circuit assembly 200 has smaller physical dimensions than flexible circuit, assembly 126 and comprises a single switch 214 in first inner layer 206.

This embodiment may be preferred where it is desired that would-be tamperers not know in advance the location of the security feature they are attempting to disable. In particular, because of the small physical dimensions of flexible circuit assembly 200, this device may be affixed to an input device in a random position during manufacturing. It will be appreciated that random positioning of flexible circuit assembly 200 adds an additional security feature to be overcome. Depending on the application, it may be desirable to use more than one circuit assembly 200 with a single input device, arranged randomly with respect to each other.

Figure 8A:
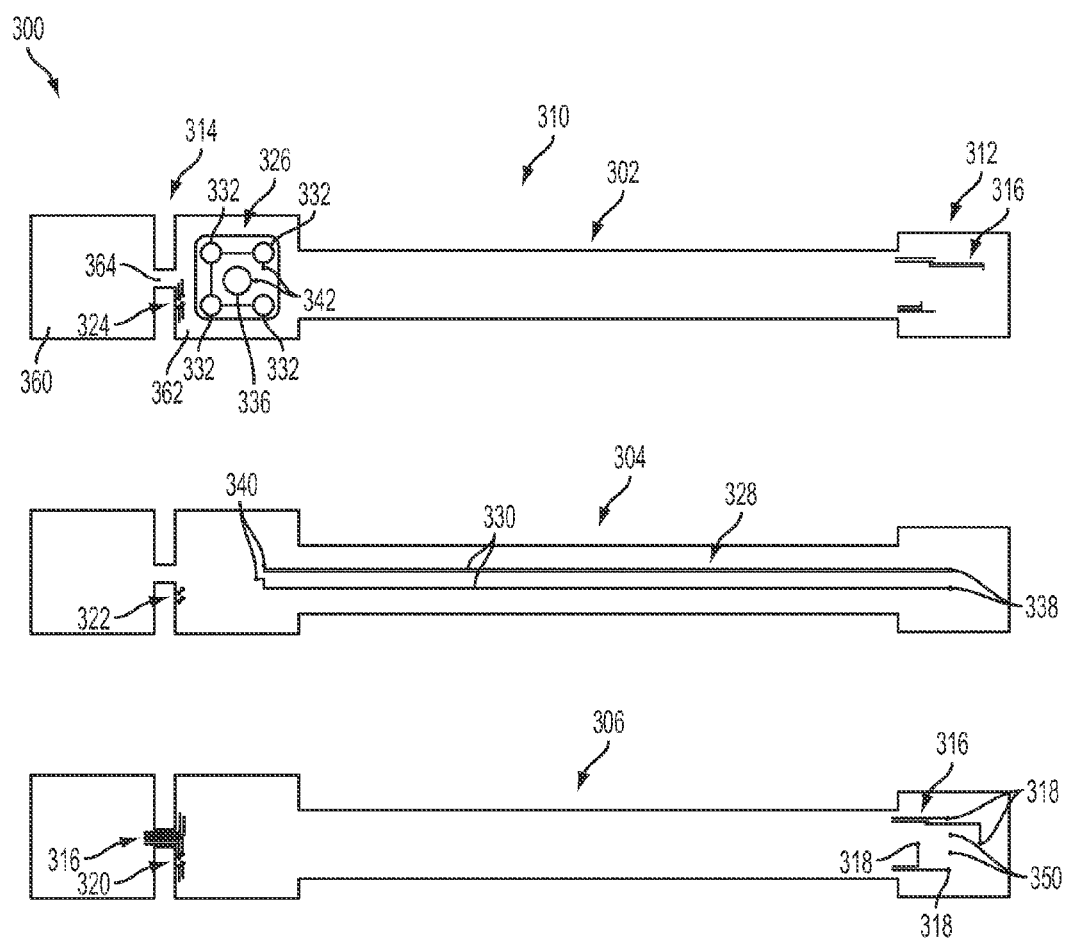
FIG. 8A is top view illustrating three layers of a flexible circuit assembly according to a further embodiment of the present invention.
Figure 8B:
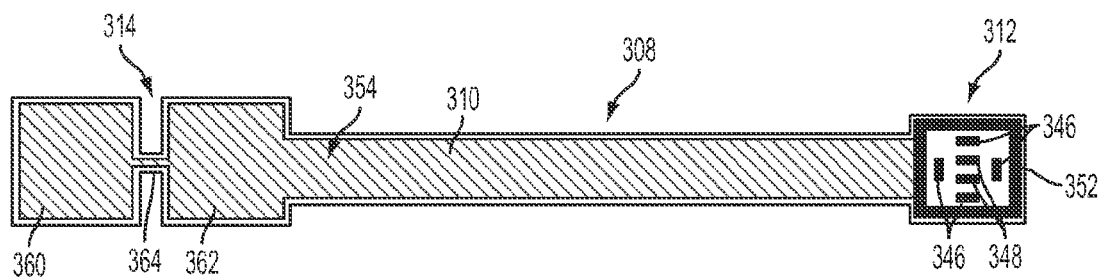
FIG. 8B is a bottom view of a fourth layer of the flexible circuit assembly of FIG. 8A.
Figure 8C:
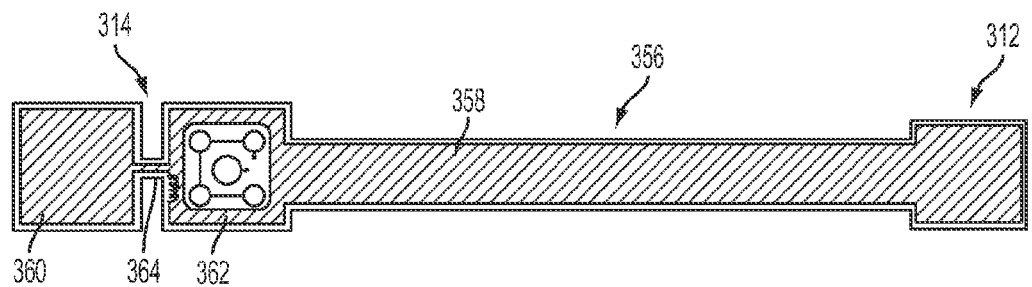
FIG. 8C is a top view of an optional fifth layer of the flexible circuit assembly of FIG. 8A.

FIGS. 8A-8C illustrate layers of a flexible circuit assembly 300 according to a further embodiment of the present invention. FIG. 8A is a top view of a first layer 302, a second layer 304, and a third layer 306 of flexible circuit assembly 300. FIG. 8B is a bottom view of a fourth layer 308 of flexible circuit assembly 300. Each of layers 302, 304, 306, 308 preferably comprise a thin, flexible dielectric substrate, as with layers 136, 138 above. Also as explained above, a suitable adhesive may be used to connect layers 302, 304, 306, and 308. When assembled, layers 302, 304, 306, and 308 define a cable 310, a connector portion 312, and a switch portion 314, (For the sake of clarity, reference numerals for cable 310, connector portion 312, and switch portion 314 are only shown with respect to first layer 302 in FIG. 8A. It will be appreciated, however, that these elements of flexible circuit assembly 300 also comprise each of layers 304, 306, and 308.)

First layer 302 and third layer 306 preferably comprise a tamper-responsive conductor circuit 316 analogous to tamper-responsive conductor circuits 140, 148, 210, and 212, described above. It will be appreciated that tamper-responsive conductor circuit 316 is only partially illustrated for clarity in FIG. 8A. More particularly, in third layer 306, tamper-responsive conductor circuit 316 may comprise conductive tracks which substantially cover third layer 306 and which extend between vias 318 in connector portion 312 and end points 320. Provided over end points 320 in second layer 304 are vias 322 such that tamper-responsive conductor circuit 316 may pass through second layer 304 to first layer 302. There, tamper-responsive conductor circuit 316 may extend from vias 324, which allow electrical connection with the conductive tracks in third layer 306, to substantially cover first layer 302.

Figure 9:
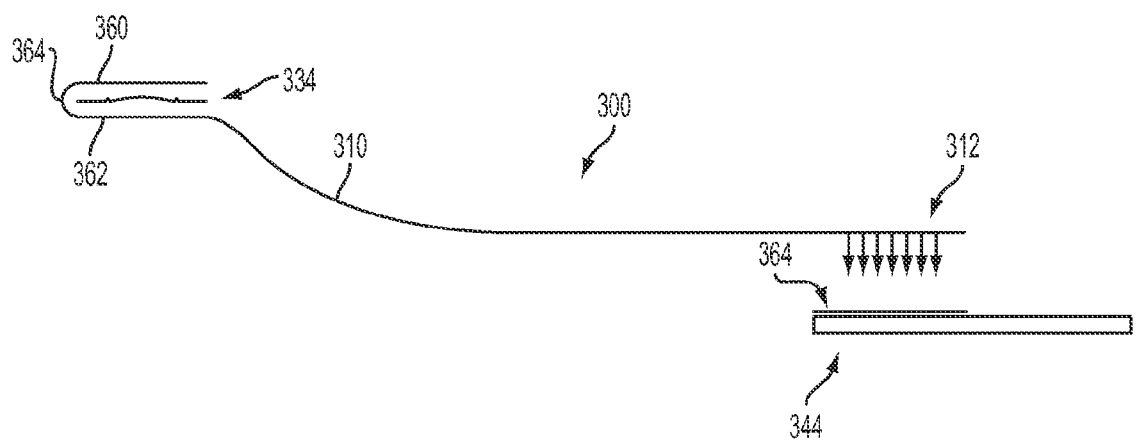
FIG. 9 is a diagrammatic side view illustrating attachment of the flexible circuit assembly of FIG. 8 to a printed circuit board.

In this embodiment, a switch 326 may be provided in first layer 302. Switch 326, which may preferably be similar to switches 134 and 214, may selectively complete a normally-open removal detection circuit 328, conductive tracks 330 for which may be disposed in second layer 304. Switch 326 may include conductive pads 332 which contact the periphery of a metal dome 334 (FIG. 9). When metal dome 334 is depressed, it contacts another conductive pad 336 to close removal detection circuit 328. In particular, in second layer 304, conductive tracks 330 extend between vias 338 in connector portion 312 and vias 340 in switch portion 314. In first layer 302, switch 326 is in electrical communication with tracks 330 by way of vias 342.

Referring now to FIG. 8B, fourth layer 308 is the bottom layer of flexible circuit assembly 300 and preferably comprises a plurality of contacts in connector portion 312 for electrical communication with corresponding contacts on a printed circuit board 344 (FIG. 9). For example, fourth layer 308 may comprise four contacts 346 in electrical communication with tamper-responsive conductor circuit 316 by way of vias 318. Further, fourth layer 308 may comprise two contacts 348 in electrical communication with conductive tracks 330 of removal detection circuit 328 by way of vias 350 in third layer 306 and vias 338 in second layer 304. Also, fourth layer 308 may comprise a ground terminal 352 surrounding pads 346, 348. Finally, fourth layer 308 may comprise a copper plane 354. As will be appreciated by those of ordinary skill in the art, copper plane 354 may be used to shield against X-ray observation of tamper-responsive conductor circuit 316 and removal detection circuit 328.

Also, in accordance with an alternative embodiment of flexible circuit assembly 300, FIG. 8C is a top view of an optional fifth layer 356 which may be added on top of first layer 302. As with fourth layer 308, fifth layer 356 may comprise a copper plane 358. However, as shown in FIG. 8C, where fifth layer 356 is provided, a switch analogous to switch 326 may be disposed in this layer rather than in first layer 302 (which would still comprise tamper-responsive conductor circuit 316). Copper plane 358 is grounded by way of suitable vias (not shown in FIG. 8C).

Notably, in a preferred embodiment of flexible circuit assembly 300, switch portion 314 is formed as two halves 360, 362 of an anti-tampering "shell." More specifically, halves 360, 362, which in this embodiment are square but which may be any suitable shape, may be connected by a hinge portion 364. During manufacture, after inserting metal dome 334 over pads 332, 336, half 360 may be folded at hinge portion 364 and secured over corresponding half 362 with suitable adhesive. (See also FIG. 9). Thus, switch 326 may be embedded in the anti-tampering shell, which provides additional security. In particular, because of tamper-responsive conductor circuit 316, any attempt to open or access this anti-tampering "shell" will break circuit 316, causing a tamper response. In other words, once switch 326 is "armed," it cannot be disabled without triggering a tamper response.

FIG. 9 is a diagrammatic side view illustrating attachment of flexible circuit assembly 300 to a printed circuit board 344. Printed circuit board 344 preferably comprises at least two layers having tamper-responsive conductor circuits provided above and below the circuitry on circuit board 344, as is well known. Thus, like the circuitry in flexible circuit assembly 300, the circuitry on printed circuit board 344 is fully protected against tampering. Further, printed circuit board 344 preferably also comprises a secure area comprising tamper response circuitry, which may be analogous to secure area 154 described in detail above. In printed circuit board 344, conductors for removal detection circuit 328 preferably extend from this secure area to the point at which connector portion 312 of flexible circuit assembly 300 will be attached to printed circuit board 344.

More specifically, connector portion 312 may be secured to circuit board 344 in the desired location (indicated by arrows in FIG. 9) using conductive adhesive 364. Thereby, any attempt to remove flexible circuit assembly 300 from circuit board 344 will rupture tamper-responsive conductor circuit 316 and/or open the circuit completed via conductive adhesive 364, thus causing a tamper response. Those of skill in the art are familiar with suitable conductive adhesive 364, which preferably permits conduction through its thickness but not across its surface.

Thus, once removal detection circuit 328, protected above and below by tamper-responsive conductor circuit 316, is connected using conductive adhesive 364 with corresponding conductors in printed circuit board 344, protected above and below by tamper-responsive conductor circuit layers, the signals for removal detection circuit 328 pass between switch 326 and the secure area of circuit board 344 through a "secure tunnel." Further, using conductive adhesive 364 to attach flexible circuit assembly 300 to printed circuit board 344 increases flexibility in mounting. For example, flexible circuit assembly 300 may be mounted anywhere on printed circuit board 344 as long as the circuitry for removal detection circuit 328 within printed circuit board 344 is protected by tamper-responsive conductor circuit layers. In other words, because of the protection afforded by tamper-responsive conductor circuits in flexible circuit assembly 300 and in the circuit board, it is not necessary to mount flexible circuit assembly 300 in a location designed to provide additional tamper protection, such as underneath a metal housing.

As explained above, in some embodiments of the present invention, the tamper-response electronics may be located in the input device which the flexible circuit assembly is protecting. However, this need not be the case. A flexible circuit assembly in accordance with the present invention may protect one input device but be in electrical communication with tamper-response electronics in another device. This allows a flexible circuit assembly to be used with any of the devices which may be provided in a user interface, such as user interface 74 described above, in many different configurations.

Figure 10:
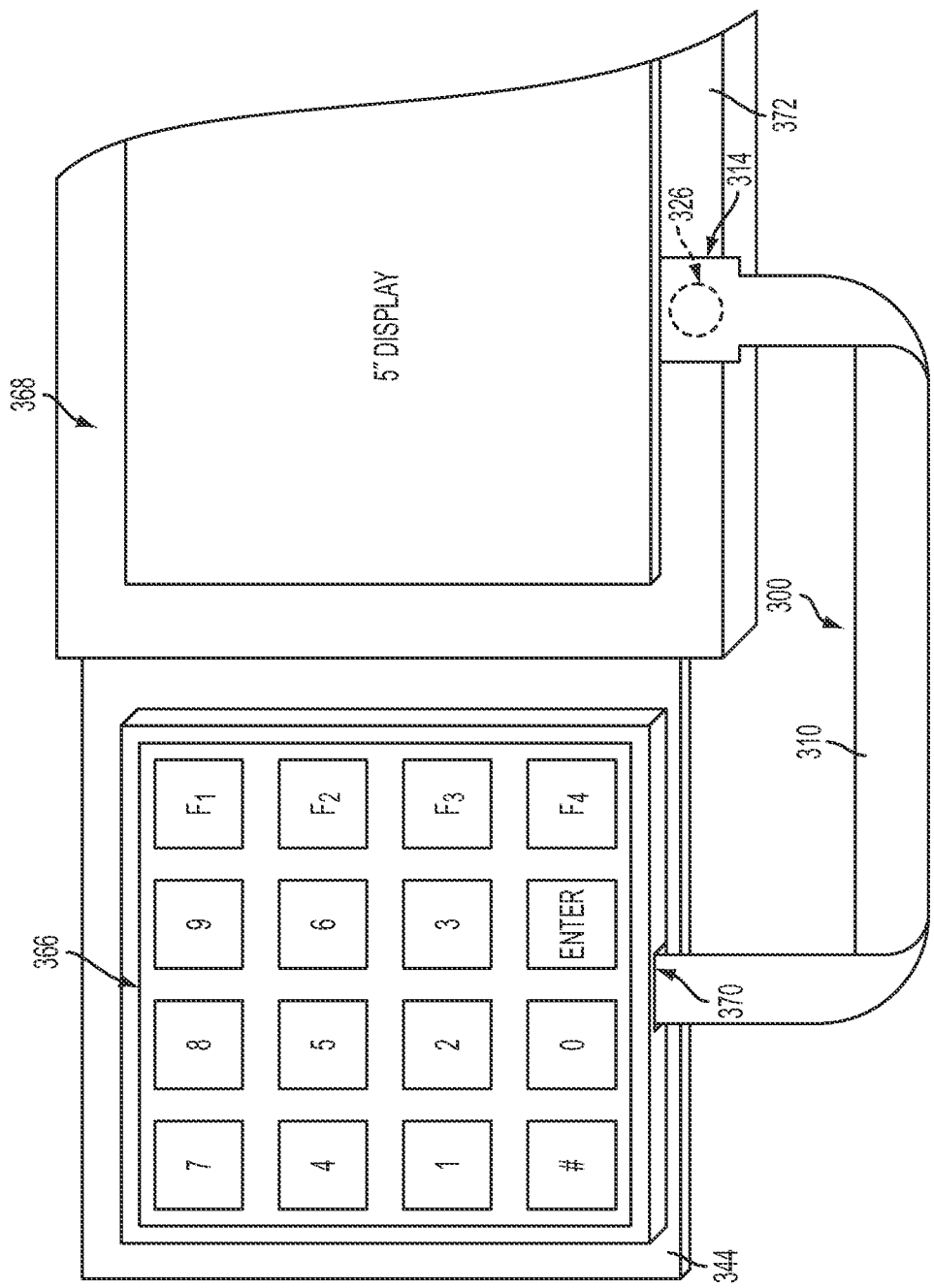
FIG. 10 is a perspective view of the flexible circuit assembly of FIG. 8 in use with a PIN pad and a display device.

For example, FIG. 10 is a perspective view of flexible circuit assembly 300 in use with a keypad 366 and a display 368. Keypad 366 and display 368 may be analogous to keypad 78 and display 90 and thus may be configured for mounting with a bezel of a fuel dispenser, such as bezel 76. Here, keypad 366 is coupled with circuit board 344, to which connector portion 312 is attached at a position which corresponds to an opening 370 in the metal housing of keypad 366. However, switch portion 314 of flexible circuit assembly 300 is coupled to a frame 372 of display 368, which adjoins a rear, or interior, surface of the bezel. When keypad 366 and display 368 are mounted in the bezel, switch portion 314 may be "sandwiched" between frame 372 and the bezel to close switch 326. Thus, if display 368 is tampered with, causing removal detection circuit 328 to open, tamper response electronics on circuit board 344 associated with keypad 366 will produce a tamper response.

While one or more preferred embodiments of the invention have been described above, it should be understood that any and all equivalent realizations of the present invention are included within the scope and spirit thereof. The embodiments depicted are presented by way of example only and are not intended as limitations upon the present invention. Thus, it should be understood by those of ordinary skill in this art that the present invention is not limited to these embodiments since modifications can be made. Therefore, it is contemplated that any and all such embodiments are included in the present invention as may fall within the scope and spirit thereof.

What is claimed is:

1. A system for detecting unauthorized removal or tampering, said system comprising:
   a printed circuit board having tamper-response electronics; and
   a flexible circuit assembly defining a connector portion, a switch portion, and a cable extending between said connector portion and said switch portion, said flexible circuit assembly coupled with said printed circuit board at said connector portion;
   said flexible circuit assembly comprising:
      a plurality of layers each comprising a flexible dielectric substrate;
      a switch disposed in said switch portion, said switch in electrical communication with said tamper-response electronics of said printed circuit board via a conductive path; and
      a tamper-responsive conductor circuit enclosing said conductive path, said tamper-responsive conductor circuit in electrical communication with said tamper-response electronics of said printed circuit board.

2. The system of claim 1, wherein said switch, said conductive path, and said tamper-response electronics comprise a removal detection circuit which is closed when said switch portion is mounted between a user interface device and a structure.

3. The system of claim 2, wherein said printed circuit board is not located in said user interface device.

4. The system of claim 2, wherein said switch is a membrane switch.

5. The system of claim 1, said flexible circuit assembly further comprising at least one copper plane to shield against inspection of said tamper-responsive conductor circuit and said conductive path.

6. The system of claim 5, further comprising first and second copper planes disposed above and below said tamper-responsive conductor circuit and said conductive path.

7. The system of claim 1, wherein said switch portion comprises a first half and a second half connected by a hinge portion.

8. The system of claim 7, wherein said switch portion is folded at said hinge portion and said first half is secured over said second half.

9. The system of claim 7, wherein said switch is disposed between said first and second halves of said switch portion.

10. The system of claim 1, wherein said flexible circuit assembly is coupled with said printed circuit board using conductive adhesive.

11. A method of detecting unauthorized removal or tampering, said method comprising the steps of:
   providing a printed circuit board having tamper-response electronics;
   providing a flexible circuit assembly comprising:
      a switch portion comprising a connector portion, a switch portion, and a cable extending between said connector portion and said switch portion;
      said switch portion comprising a first half and a second half connected by a hinge portion;
      a plurality of layers each comprising a flexible dielectric substrate;
      a switch disposed in said switch portion, said switch in electrical communication with said tamper-response electronics of said printed circuit board via a conductive path; and
      a first tamper-responsive conductor circuit enclosing said conductive path, said first tamper-responsive conductor circuit in electrical communication with said tamper-response electronics of said printed circuit board;
   mounting said flexible circuit assembly to said printed circuit board at said connector portion; and folding said switch portion at said hinge portion and securing said first half over said second half to embed said switch between said first and second halves.

12. The method of claim 11, further comprising mounting said switch portion between a user interface device and a structure.

13. The method of claim 11, further comprising monitoring electrical characteristics of said first tamper-responsive conductor circuit.

14. The method of claim 13, further comprising producing a tamper response at said tamper-response electronics when a change in electrical characteristics of said first tamper-responsive conductor circuit, is detected.

15. The method of claim 11, wherein said switch, said conductive path, and said tamper-response electronics comprise a removal detection circuit which is closed during said mounting step.

16. The method of claim 15, wherein said switch is a membrane switch.

17. The method of claim 15, wherein said printed circuit board comprises at least one layer comprising a second tamper-responsive conductor circuit.

18. The method of claim 17, wherein said removal detection circuit is enclosed by said first and second tamper-responsive conductor circuits.

19. The method of claim 11, further comprising applying a conductive adhesive between said connector portion and said printed circuit board to facilitate mounting.

20. The method of claim 19, wherein said conductive adhesive permits conduction through its thickness but not across its surface.

* * * * *

UNITED STATES PATENT AND TRADEMARK OFFICE
CERTIFICATE OF CORRECTION

| | | |
|---|---|---|
| PATENT NO. | : 9,166,586 B2 | Page 1 of 1 |
| APPLICATION NO. | : 13/467592 | |
| DATED | : October 20, 2015 | |
| INVENTOR(S) | : Giovanni Carapelli, Philip A. Robertson and Alberto Tosi | |

It is certified that error appears in the above-identified patent and that said Letters Patent is hereby corrected as shown below:

In the specification,

Column 5, line 4, please delete the word "LIST" and replace with --UST--.

Column 8, line 30, please delete the word "swatches" and replace with the word --switches--.

Signed and Sealed this
Twenty-ninth Day of March, 2016

Michelle K. Lee
*Director of the United States Patent and Trademark Office*